United States Patent
Chang et al.

(10) Patent No.: US 9,524,769 B2
(45) Date of Patent: Dec. 20, 2016

(54) SMART IN-MODULE REFRESH FOR DRAM

(71) Applicant: Samsung Electronics Co., Ltd., Suwon-si, Gyeonggi-do (KR)

(72) Inventors: Mu-Tien Chang, San Jose, CA (US); Krishna Malladi, San Jose, CA (US); Dimin Niu, Sunnyvale, CA (US); Hongzhong Zheng, Sunnyvale, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/850,938

(22) Filed: Sep. 10, 2015

(65) Prior Publication Data

US 2016/0307619 A1 Oct. 20, 2016

Related U.S. Application Data

(60) Provisional application No. 62/149,507, filed on Apr. 17, 2015.

(51) Int. Cl.
*G11C 5/14* (2006.01)
*G11C 11/406* (2006.01)
*G11C 11/4076* (2006.01)

(52) U.S. Cl.
CPC .......... *G11C 11/40615* (2013.01); *G11C 5/14* (2013.01); *G11C 11/4076* (2013.01)

(58) Field of Classification Search
CPC ................................ G11C 5/14; G11C 11/406
USPC .................................................. 365/222, 226
See application file for complete search history.

(56) References Cited

U.S. PATENT DOCUMENTS

| | | | | |
|---|---|---|---|---|
| 5,887,146 A | * | 3/1999 | Baxter | G06F 11/22 710/104 |
| 6,072,741 A | * | 6/2000 | Taylor | G06F 5/10 365/219 |
| 6,256,249 B1 | * | 7/2001 | Phelan | G11C 11/406 365/189.04 |
| 7,929,369 B2 | * | 4/2011 | Lee | G11C 11/406 365/222 |
| 8,606,991 B2 | | 12/2013 | Sun et al. | |
| 8,687,446 B2 | * | 4/2014 | Lee | G11C 11/406 365/193 |
| 2003/0206476 A1 | * | 11/2003 | Joo | G11C 7/065 365/222 |
| 2008/0049532 A1 | * | 2/2008 | Kajigaya | G11C 8/12 365/222 |
| 2009/0157950 A1 | * | 6/2009 | Selinger | G06F 12/0246 711/103 |
| 2009/0296510 A1 | * | 12/2009 | Lee | G11C 11/406 365/222 |

(Continued)

*Primary Examiner* — Michael Tran
(74) *Attorney, Agent, or Firm* — Renaissance IP Law Group LLP (57) ABSTRACT

A dynamic Random Access Memory (DRAM) module (105) is disclosed. The DRAM module (105) can includes a plurality of banks (205-1, 205-2, 205-3, 205-4) to store data and a refresh engine (115) that can be used to refresh one of the plurality of banks (205-1, 205-2, 205-3, 205-4). The DRAM module (105) can also include a Smart Refresh Component (305) that can advise the refresh engine (115) which bank to refresh using an out-of-order per-bank refresh. The Smart Refresh Component (305) can use a logic (415) to identify a farthest bank in the pending transactions in the transaction queue (430) at the time of refresh.

20 Claims, 9 Drawing Sheets

(56) References Cited

U.S. PATENT DOCUMENTS

| | | | |
|---|---|---|---|
| 2012/0176840 A1* | 7/2012 | Norman | G06F 17/5045 365/185.08 |
| 2013/0080694 A1 | 3/2013 | Iyer et al. | |
| 2013/0339592 A1* | 12/2013 | Yu | G06F 13/1668 711/105 |
| 2014/0047176 A1 | 2/2014 | Poddar | |
| 2014/0108773 A1* | 4/2014 | Jagatheesan | G06F 12/0653 713/1 |
| 2014/0192605 A1 | 7/2014 | Crawford et al. | |
| 2014/0254298 A1* | 9/2014 | Dally | G11C 11/406 365/222 |
| 2014/0293671 A1* | 10/2014 | Perego | G11C 5/025 365/63 |

* cited by examiner

| Refresh Status Table | |
|---|---|
| Bank ID | T/F |
| 0 | T |
| 1 | F |
| 2 | F |
| 3 | F |

| Last Accessed Bank Table | |
|---|---|
| Bank ID | T/F |
| 0 | F |
| 1 | F |
| 2 | F |
| 3 | T |

| Least Frequently Accessed Bank Table | | |
|---|---|---|
| Bank ID | Count | T/F |
| 0 | 1 _715_ | F |
| 1 | 4 _725_ | F |
| 2 | 2 _735_ | F |
| 3 | 1 _745_ | T |

SMART IN-MODULE REFRESH FOR DRAM

RELATED APPLICATION DATA

This application claims the benefit of U.S. Provisional Patent Application Ser. No. 62/149,507, filed Apr. 17, 2015, which is hereby incorporated by reference for all purposes.

FIELD

The inventive concept pertains to memory, and more particularly to refreshing memory to minimize the impact on ordinary memory operations.

BACKGROUND

Dynamic Random Access Memory (DRAM) is a form of memory currently used in computer systems. DRAM uses capacitors as part of the circuits that store data. Because capacitors are not ideal, they eventually lose their charge. If the capacitors in the DRAM lose enough charge, the data stored in the DRAM may be lost.

To counter this problem, DRAM can refresh the data it stores. Essentially, all the data is read out of the DRAM, then written back. By writing the data values back into the DRAM, the capacitors are recharged, and can continue to store the data.

Because refreshing data requires being able to read the data from the DRAM, a refresh operation needs to occur before the capacitors in the DRAM have lost too much charge. How long it takes before the capacitors have lost too much charge depends on the implementation of the DRAM. In one standard, the refresh is scheduled to occur every 64 milliseconds (ms).

But because a refresh operation requires reading and writing the data from the DRAM, performing a refresh can interrupt other operations using the memory. For example, an application might be reading some data from the DRAM when a refresh needs to occur. The read operation must wait until the refresh has completed: if not, data values might be lost. This delay is not insignificant: depending on the specific implementation of DRAM, the delay caused by a refresh operation can be 18.5% or more. And the delay caused by refresh will only increase as the density of DRAM and the speed of operations increase.

A need remains for a way to reduce the impact of refresh operations on DRAM.

DETAILED DESCRIPTION

Reference will now be made in detail to embodiments of the inventive concept, examples of which are illustrated in the accompanying drawings. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first module could be termed a second module, and, similarly, a second module could be termed a first module, without departing from the scope of the inventive concept.

The terminology used in the description of the inventive concept herein is for the purpose of describing particular embodiments only and is not intended to be limiting of the inventive concept. As used in the description of the inventive concept and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Figure 1A:
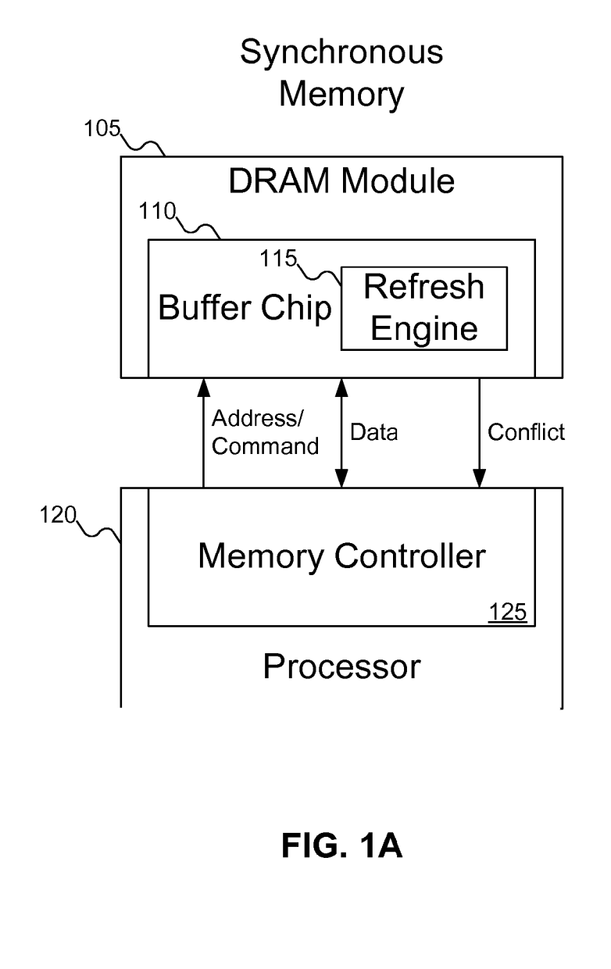
FIGS. 1A-1B show in-module refresh engines for synchronous and transaction-based DRAM modules.
Figure 1B:
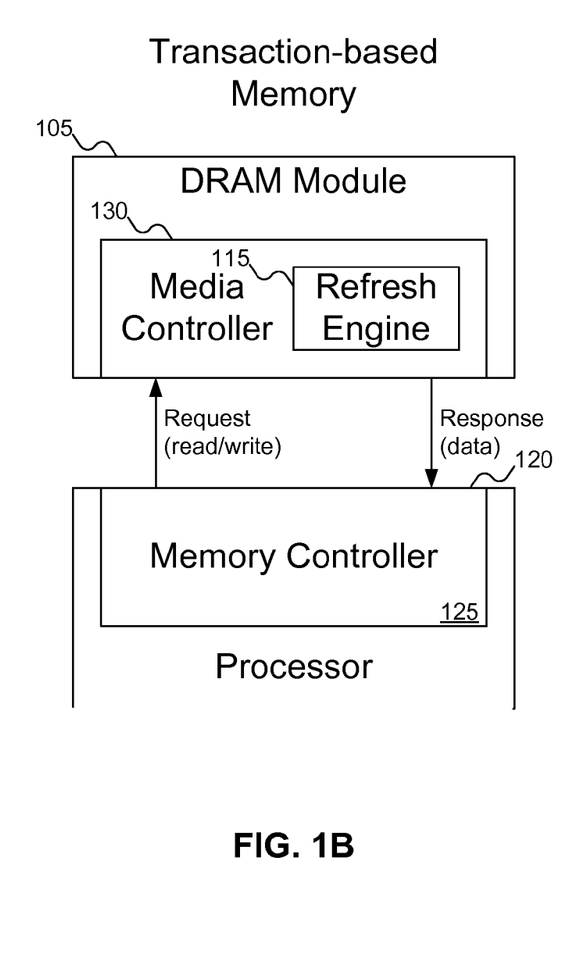

FIGS. 1A-1B show example embodiments of the inventive concept for DRAM 105. DRAM 105 can include buffer chip 110 (sometimes called a media controller), which can include refresh engine 115. Refresh engine 115 is responsible for refreshing the data stored in DRAM 105. DRAM 105 can communicate with memory controller 120, shown in FIGS. 1A-1B as part of processor 125. The difference between FIGS. 1A-1B is that FIG. 1A shows a synchronous DRAM module, whereas FIG. 1B shows a transaction-based DRAM module. The modules differ in terms of their timing and how they communicate with memory controller 120. But refresh operates the same in both types of DRAM modules.

Note that in other embodiments of the inventive concept, refresh engine 115 can be part of memory controller 120, rather than necessarily being in-module with DRAM 105. An advantage of including refresh engine 115 in-module is that in-module refresh can improve design flexibility and potentially improves performance. In addition, FIGS. 1A-1B show memory controller 120 as being integrated with processor 125. But in other embodiments of the inventive concept, memory controller 120 can be separate from processor 125.

DRAM module 105 can be refreshed in different granularities. For instance, some DRAM modules 105 perform all-bank refresh, in which all banks are refreshed simultaneously when a refresh command is issued. Other DRAM modules 105 can perform per-bank refresh. When using per-bank refresh, only one bank is refreshed at a time. Still other DRAM modules 105 can perform either all-bank refresh or per-bank refresh.

When a refresh command is issued, the bank(s) being refreshed is(are) not available. Thus, when all-bank refresh is used, DRAM module 105 cannot be accessed at all until the refresh completes. Using per-bank refresh has an advantage, in that it might be possible to hide the refresh operations. (In this context, "hiding" the refresh operation refers to the fact that DRAM module 105 can still process and respond to data requests to access other banks in DRAM module 105. As far as any applications running in processor 125 are concerned, the refresh command generally appears to be performed at a time when the application is not accessing DRAM module 105.) But because per-bank refresh only refreshes one bank at a time, more refresh commands must be issued to refresh DRAM module 105. DRAM modules 105 that perform per-bank refresh refresh the banks in a particular order (i.e., round-robin).

Using a particular order to refresh the banks in a DRAM module 105, like round-robin scheduling, might help to hide the fact of refresh from applications. But there is no guarantee that the bank being refreshed is not being accessed. In fact, in the worst case, per-bank refresh can reduce an application's performance even more than all-bank refresh. For example, assume that DRAM module 105 includes four banks, has a refresh interval of 64 milliseconds (ms), and requires 30 nanoseconds (ns) to perform a refresh (be it for one bank or all banks), and the memory is operating at 133 megahertz (MHz). This means that a refresh command requires 4 clock cycles (($1.33 \times 10^8$)×($30 \times 10^{-9}$)=4), regardless of whether only one bank is being refreshed or all banks are being refreshed.

If DRAM module 105 performs all-bank refresh, then all banks are unavailable for 4 clock cycles, denying the application any data during those cycles. Using per-bank refresh, different banks are each unavailable for 4 cycles. As there are four banks total, the total time required to refresh every bank would be 16 clock cycles. But consider the situation where each bank refresh command happened to occur just before an application needed to access data from the bank being refreshed. The application would then be delayed by 16 cycles per refresh interval. This shows that in-order per-bank refresh might actually result in worse performance for the application than all-bank refresh.

One way to perform out-of-order per-bank refresh is to randomly select a bank for refresh whenever a refresh command is to be issued. But random order does not guarantee improved performance of applications any more than does in-order per-bank refresh.

Figure 2:
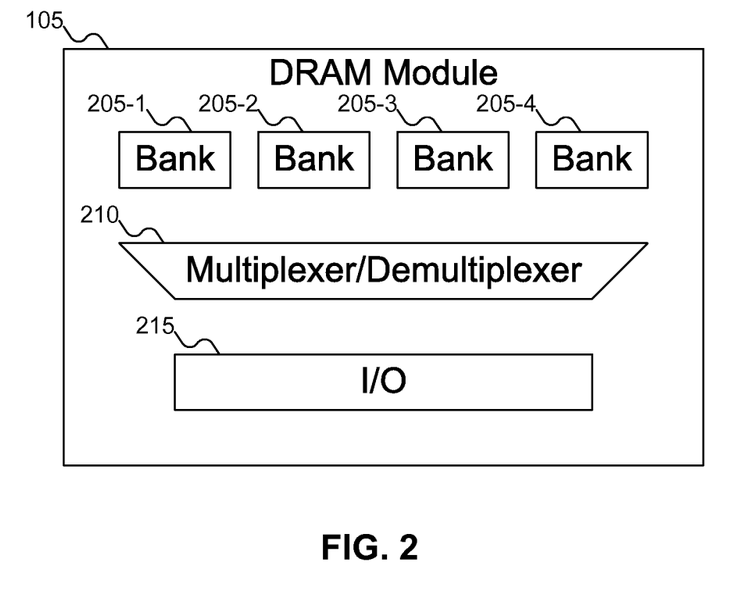
FIG. 2 shows details of the DRAM module of FIGS. 1A-1B.

Before addressing how per-bank refresh can be performed in a manner that generally improves on the responsiveness of DRAM 105 over all-bank refresh, a quick, high-level review of the architecture of DRAM module 105 is worthwhile. As shown in FIG. 2, DRAM module 105 can include a number of banks, such as banks 205-1, 205-2, 205-3, and 205-4. A bank is generally considered to be a set of memory arrays that can be activated, read, charged, etc. independently of other banks. While FIG. 2 shows DRAM module 105 as including four banks, DRAM module 105 can include any number of banks, as desired. Of course, if DRAM module 105 only has one bank, then there is no difference between per-bank refresh and all-bank refresh, so it is presumed for the remainder of this discussion that DRAM module 105 includes at least two banks.

DRAM module 105 can also include multiplexer/demultiplexer 210, which can be used to manage what data is input to and output from banks 205-1, 205-2, 205-3, 205-4, and I/O module 215, which provides input and output functionality for DRAM module 105.

Figure 3:
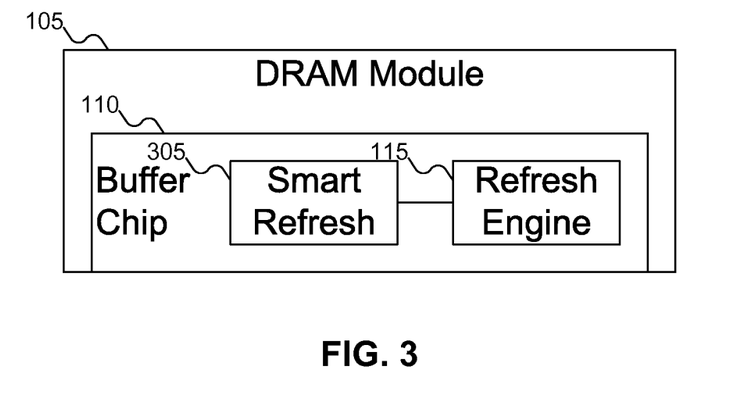
FIG. 3 shows a DRAM module, according to an embodiment of the inventive concept.

Turning now to how out-of-order per-bank refresh according to some embodiments of the inventive concept can be used to generally hide refresh operations, FIG. 3 shows DRAM module 105, according to an embodiment of the inventive concept. As compared with FIGS. 1A-1B, DRAM module 105, and more particularly, buffer chip 110 in some embodiments of the inventive concept, can include Smart Refresh Component 305. Smart Refresh Component 305 can advise refresh engine 115 as to which bank is most likely to be hidden from applications (or, put another way, which bank is least likely to impact an application by undergoing a refresh command).

Figure 4:
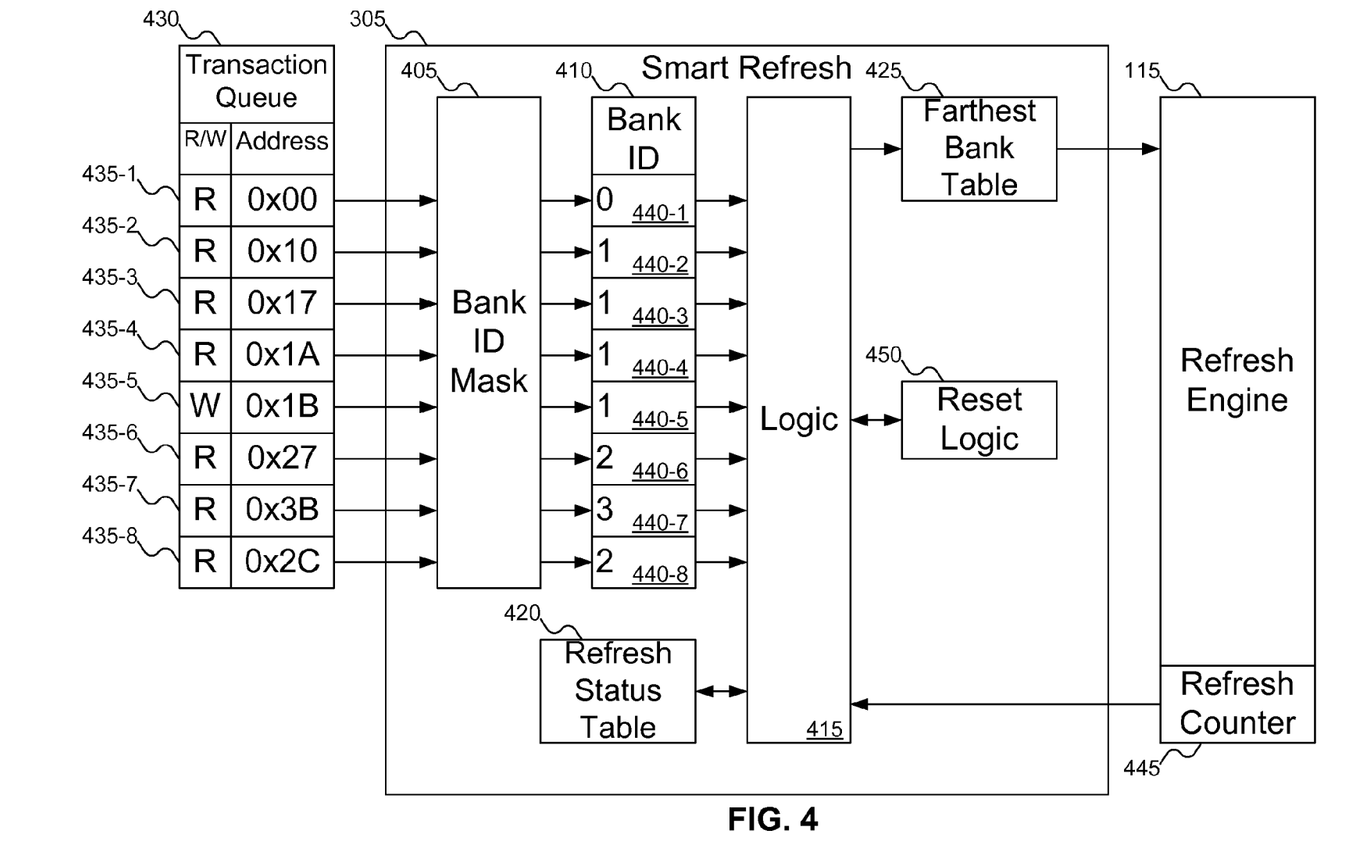
FIG. 4 shows details of the Smart Refresh Component of FIG. 3.

FIG. 4 shows details of an example embodiment of Smart Refresh Component 305 of FIG. 3. In FIG. 4, Smart Refresh Component 305 is shown as including bank ID mask 405, bank ID table 410, logic 415, Refresh Status Table 420, and Farthest Bank Table 425. Transaction queue 430 can include a list of pending transactions for DRAM module 105. In FIG. 4, transaction queue 430 is shown as including eight transactions 435-1, 435-2, 435-3, 435-4, 435-5, 435-6, 435-7, and 435-8, but there can be any number of transactions in transaction queue 430: that transaction queue 430 shows eight transactions is merely exemplary. Each of these transactions accesses a memory address in some bank in DRAM module 105. The banks associated with these eight transactions are shown in bank ID table 410 as bank IDs 440-1, 440-2, 440-3, 440-4, 440-5, 440-6, 440-7, and 440-8. So, for example, transaction 435-1 accesses bank 0 (205-1), transactions 435-2, 435-3, 435-4, and 435-5 each access bank 1 (205-2), transactions 435-6 and 435-8 access bank 2 (205-3), and transaction 435-7 accesses bank 3 (205-4).

Bank ID mask 405 can interface with transaction queue 430, access the pending transactions in transaction queue 430, and determine which banks are implicated by those transactions. Bank ID Mask 405 can the store those bank IDs in bank ID table 410. How bank ID mask 405 operates can depend on the implementation of DRAM module 105. For example, in one embodiment of the inventive concept, bank ID mask 405 can determine the bank used in the transaction by masking out particular bits from the memory address used in the transaction. This information about which banks are being used by the transactions in transaction queue 430 can be stored in bank ID table 410. In another embodiment of the inventive concept, bank ID mask 405 can use a lookup table to determine what bank is implicated by a particular transaction. A person skilled in the art will recognize other ways in which bank ID mask 405 can operate.

Logic 415 can implement the particular algorithm to select a bank for out-of-order per-bank refresh. Logic 415 can use the information in bank ID table and Refresh Status Table 420 to select a bank to suggest to refresh engine 115 for refreshing. Refresh status table 420 can store a list of banks that have already been refreshed during the current refresh interval. And Farthest Bank Table 425 can identify which bank is suggested for refresh by refresh engine 115.

In addition to these components, FIG. 4 also shows refresh counter 445 and reset logic 450. Refresh counter 445 can send a trigger signal to logic 415 to trigger the refresh of a bank in DRAM module 105. Reset logic 450 can reset Smart Refresh Component 305 (specifically, Refresh Status Table 420) after a refresh interval is complete. Resetting Refresh Status Table 420 can include clearing all of the flags indicating which banks in DRAM module 105 have already been refreshed.

Figure 6:
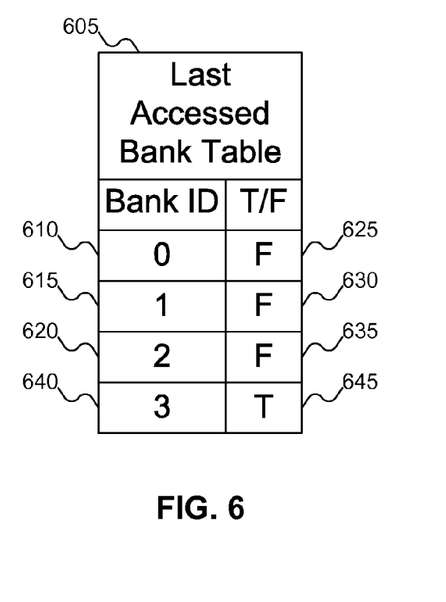
FIG. 6 shows details of the Farthest Bank Table of FIG. 4, according a first embodiment of the inventive concept.
Figure 7:
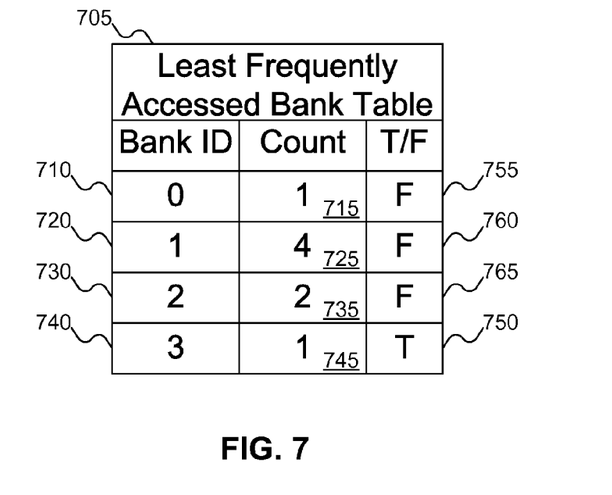
FIG. 7 shows details of the Farthest Bank Table of FIG. 4, according to a second embodiment of the inventive concept.

In different embodiments of the inventive concept, logic 415 can suggest different banks for refresh using different circuitry. FIGS. 6-7 below describe two different Farthest Bank Tables 425, used in various embodiments of the inventive concept. These different Farthest Bank Tables 425 can use different logics 415 to implement the different embodiments of the inventive concept. The particulars of how logic 415 can implement the various Farthest Bank Tables 425 are discussed below with reference to FIGS. 6-7.

Figure 5:
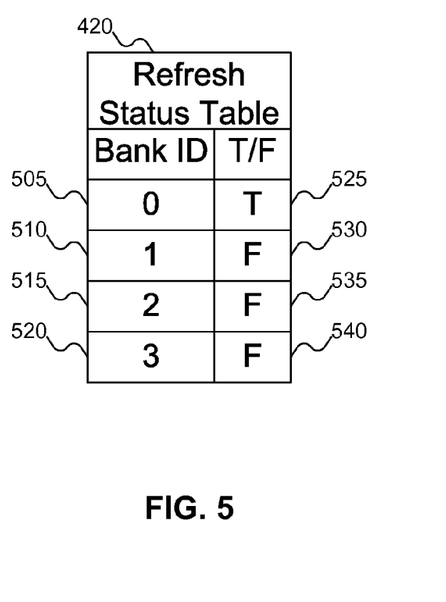
FIG. 5 shows details of the Refresh Status Table of FIG. 4.

FIG. 5 shows details of an example Refresh Status Table 420 of FIG. 4, according to some embodiments of the inventive concept. In FIG. 5, Refresh Status Table 420 can include bank IDs 505, 510, 515, and 520, and true/false flags 525, 530, 535, and 540. While FIG. 5 shows Refresh Status Table 420 as including four banks, a person skilled in the art will recognize that Refresh Status Table 420 can include any number of banks. Thus, Refresh Status Table 420 in FIG. 5 shows that in the current refresh interval, only bank 0 (entry 505) has been refreshed so far. Because Refresh Status Table 420 stores which individual banks in DRAM module 105 have been refreshed during the current refresh interval, the number of banks in Refresh Status Table 420 can match the number of banks in DRAM module 105.

FIG. 6 shows details of an example Farthest Bank Table 425 of FIG. 4, according a first embodiment of the inventive concept. In FIG. 6, Farthest Bank Table 425 is shown as Last Accessed Bank Table 605. In the embodiment of the inventive concept shown in FIG. 6, Last Accessed Bank Table 605 identifies the last bank that is to be accessed using the current transactions in transaction queue 430. When logic 415 includes circuitry to use Last Accessed Bank Table 605, logic 415 can be said to implement a time-based refresh circuit or a time-based refresh algorithm.

As an example of how Last Accessed Bank Table 605 can be used, returning to FIG. 4, assume that transaction 435-1 is the first currently pending transaction that is next to be performed, and transaction 435-8 is the last currently pending transaction to be performed. Put another way, assume that the head of transaction queue 430 is at the top of transaction queue 430. Bank ID table 410 stores the bank IDs for the corresponding transactions, which means that transaction 435-1 uses bank 0 (entry 440-1), transaction 435-2 uses bank 1 (entry 440-2), and so on. A quick scan of bank ID table 410 shows that bank 3 is the last bank to be used in a transaction in transaction queue 430: bank 3 (entry 440-7) is used in transaction 435-7. Thus, bank 3 can be identified as the last accessed bank.

Last accessed bank table 605 in FIG. 6 reflects this status. Banks 0 (entry 610), 1 (entry 615), and 2 (entry 620) are all flagged with FALSE status (entries 625, 630, and 635, respectively). Only bank 3 (entry 640) is flagged with TRUE status (entry 645). This informs refresh engine 115 which bank is the last accessed bank, and therefore the bank whose refresh is least likely to impact accesses to DRAM module 105.

Because Last Accessed Bank Table 605 stores which individual bank in DRAM module 105 is suggested to refresh engine 115 for refresh, the number of banks in Last Accessed Bank Table 605 can match the number of banks in DRAM module 105.

FIG. 7 shows details of an example Farthest Bank Table 425 of FIG. 4, according to a second embodiment of the inventive concept. In FIG. 7, Farthest Bank Table 425 is shown as Least Frequently Accessed Bank Table 705. Least frequently accessed bank table 705 can identify which bank in DRAM module 105 is the least frequently accessed bank. When logic 415 includes circuitry to use Least Frequently Accessed Bank Table 705, logic 415 can be said to implement a frequency-based refresh circuit or a frequency-based refresh algorithm.

As an example of how Least Frequently Accessed Bank Table 705 can be used, of the eight transactions shown in transaction queue 430, bank ID table 410 shows one transaction accessing bank 0 (transaction 435-1), four transactions accessing bank 1 (transactions 435-2, 435-3, 435-4, and 435-5), two transactions accessing bank 2 (transactions 435-6 and 435-8), and one transaction accessing bank 3 (transaction 435-7). These counts are shown in Least Frequently Accessed Bank Table 705 in FIG. 7: bank 0 (entry 710) has a count of 1 (entry 715), bank 1 (entry 720) has a count of 4 (entry 725), bank 2 (entry 730) has a count of 2 (entry 735), and bank 3 (entry 740) has a count of 1 (entry 745).

In FIG. 7, Least Frequently Accessed Bank Table 705 can also include flags, which can indicate which bank is suggested for refresh. In FIG. 7, bank 3 (entry 740) is flagged with TRUE status (entry 750); the other banks are flagged with FALSE status (entries 755, 760, and 765). As with Last Accessed Bank Table 605 shown in FIG. 6, Least Frequently Accessed Bank Table 705 can inform refresh engine 115 which bank is the least frequently accessed bank, and therefore the bank whose refresh is least likely to impact accessed to DRAM module 105.

Least-Frequently Accessed Bank Table 705 in FIG. 7 actually shows two banks that both have the same lowest count. Specifically, both bank 0 (entry 710) and bank 3 (entry 740) have counts of 1 (entries 715 and 745, respectively). But because Least-Frequently Accessed Bank Table 705 can be used to suggest a particular bank to be refreshed by Refresh Engine 115, Least-Frequently Accessed Bank Table 705 should only suggest a single bank for refreshing. Therefore, where more than one bank has the lowest count, logic 415 can select which bank to suggest to refresh engine 115 for refresh using any desired resolution. For example, logic 415 can select the bank with the lowest bank number, or the highest bank number. Or, logic 415 can select the bank with the lowest count that is the last accessed of the banks in transaction queue 430 (mirroring the approach used for selecting the last accessed bank, as described above). Or, logic 415 can select a bank at random. A person skilled in the art will recognize other ways in which logic 415 can select among multiple banks with the lowest count.

But in FIG. 7, the reason bank 3 (entry 740) is selected for refresh rather than bank 0 (entry 710) is simpler, and can be found in Refresh Status Table 420 of FIG. 5. Note that in FIG. 5, bank 0 (entry 505) is flagged as already having been refreshed. Since a bank is normally refreshed only once per refresh interval and bank 0 has already been refreshed in the current refresh interval, logic 415 does not need to consider bank 0 for refresh when setting the flags in Least Frequently Accessed Bank Table 705.

Because Least Frequently Accessed Bank Table 705 stores which individual bank in DRAM module 105 is suggested to refresh engine 115 for refresh, the number of banks in Least Frequently Accessed Bank Table 705 can match the number of banks in DRAM module 105.

In FIGS. 4 and 6-7, all banks in DRAM module 105 are accessed by some transaction in transaction queue 430. But it can happen that one (or more) banks might not be used in any currently pending transaction in transaction queue 430. Put another way, there might be one or more banks not listed in bank ID table 455. If there is a bank not listed in bank ID table 455 as being accessed in a currently pending transaction in transaction queue 430, then that bank can automatically be selected as the farthest bank, regardless of the particulars of logic 415. Put another way, any bank not accessed by any pending transaction can be selected for refresh, regardless of whether logic 415 implements a time-based refresh circuit or a frequency-based refresh circuit.

As mentioned above, Refresh Status Table 420 stores which individual banks in DRAM module 105 have been refreshed during the current refresh interval. If a bank that would otherwise be selected for refresh has already been refreshed during the current refresh interval, then that bank is not considered for refresh, and the next farthest bank is selected. What bank is the next farthest bank depends on whether logic 415 implements a time-based refresh circuit or a frequency-based refresh circuit, but the same logic applies, with the already-refreshed bank(s) not subject to consideration.

Figure 8:
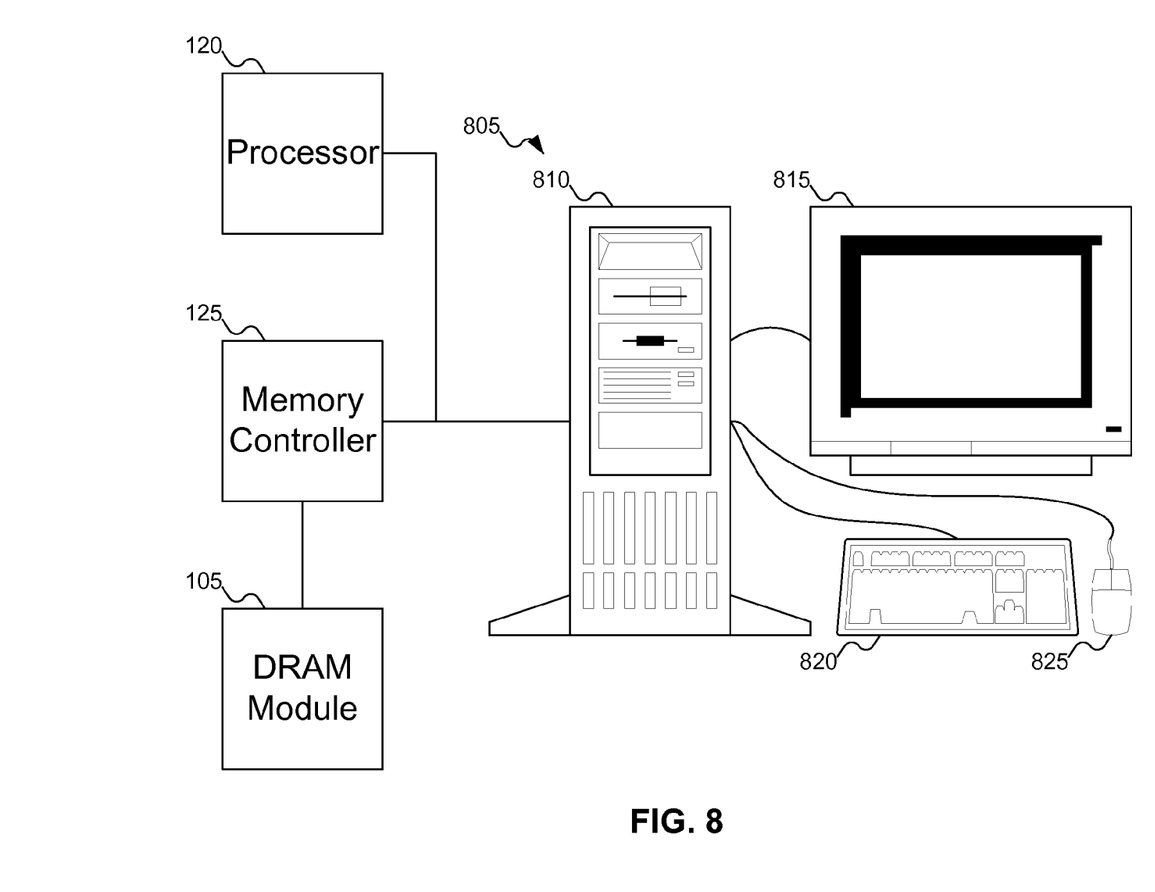
FIG. 8 shows a computer system including the DRAM module of FIG. 3.

FIG. 8 shows a computer system including DRAM module 105 of FIG. 3. In FIG. 8, computer system 805 is shown as including computer 810, monitor 815, keyboard 820, and mouse 825. A person skilled in the art will recognize that other components can be included with computer system 805: for example, other input/output devices, such as a printer, may be included. In addition, computer system 805 can include conventional internal components such as central processing unit 120, memory controller 125, and DRAM module 105. Although not shown in FIG. 8, a person skilled in the art will recognize that computer system 805 can include other internal components, such as other storage devices. In addition, a person skilled in the art will recognize that computer system 805 can interact with other computer systems, either directly or over a network (not shown) of any type. Finally, although FIG. 8 shows computer system 805 as a conventional desktop computer, a person skilled in the art will recognize that computer system 805 can be any type of machine or computing device, including, for example, a laptop computer, a tablet computer, a personal digital assistant (PDA), or a smart phone, among other possibilities.

The above description focuses on using smart refresh in a DRAM module. But embodiments of the inventive concept are applicable to any situation in which a memory module requires refresh. Thus, for example, if DRAM is used in a cache or buffer, embodiments of the inventive concept can be used with the memory module in the cache or buffer.

Figure 9:
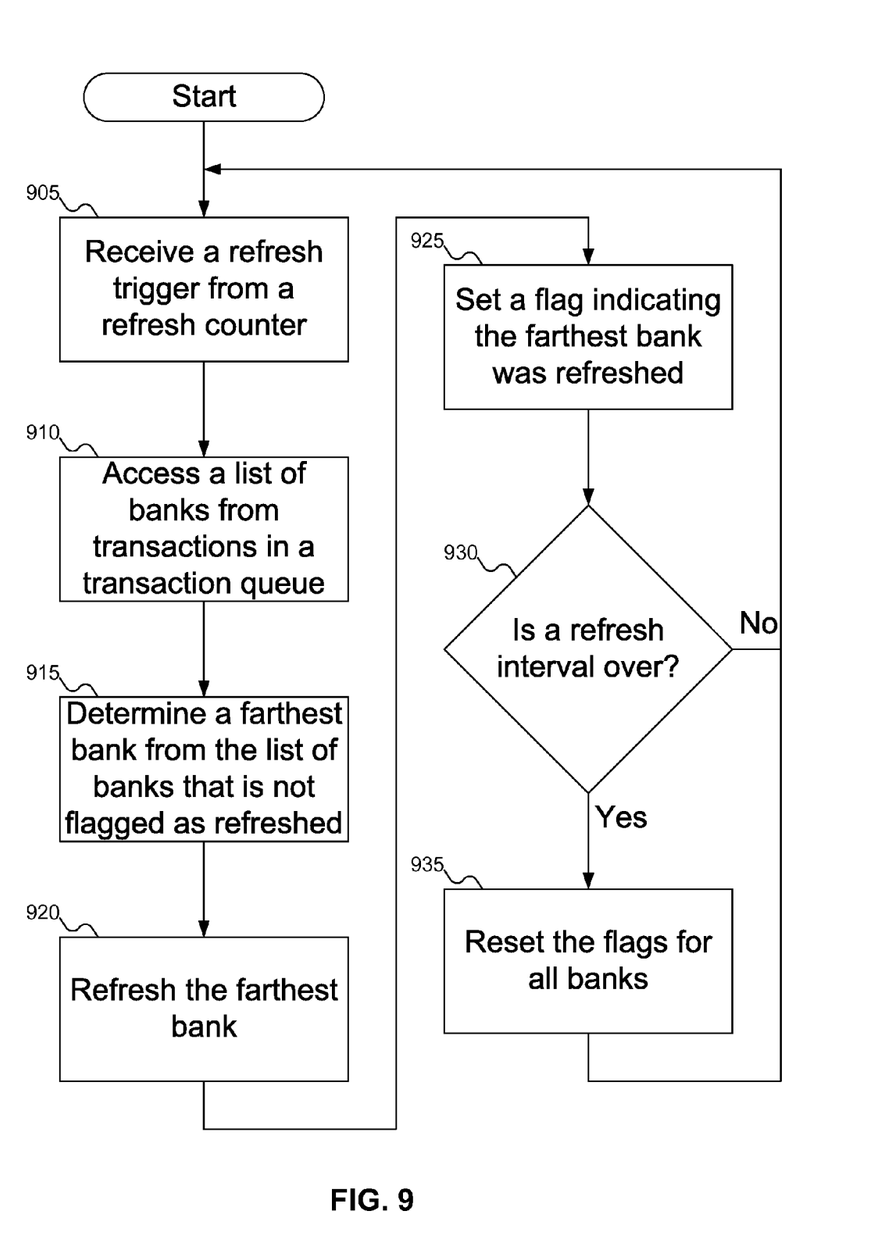
FIG. 9 shows a flowchart of a procedure for performing a smart refresh of a bank in the DRAM module of FIG. 3.

FIG. 9 shows a flowchart of a procedure for performing a smart refresh of a bank in DRAM module 105 of FIG. 3, according to an example embodiment of the inventive concept. In FIG. 9, at block 905, Smart Refresh Component 305 of FIG. 3 can receive a trigger from refresh counter 445 of FIG. 4, triggering an out-of-order per-bank refresh command. At block 910, Smart Refresh Component 305 of FIG. 3 can access a list of banks from bank ID table 410 of FIG. 4: the banks listed in bank ID table 410 of FIG. 4 can identify the banks being used by transactions in transaction queue 430 of FIG. 4. At block 915, Smart Refresh Component 305 of FIG. 3 can determine the farthest bank from bank ID table 410 of FIG. 4 that has not already been refreshed in the current refresh interval. As described above, Smart Refresh Component 305 of FIG. 3 can use any desired algorithm to determine the farthest bank, such as the last accessed bank or the least frequently accessed bank. At block 920, refresh engine 115 of FIG. 1 can refresh the farthest bank, as suggested by Smart Refresh Component 305 of FIG. 3. At block 925, Smart Refresh Component 305 of FIG. 3 can set a flag in Refresh Status Table 420 of FIG. 4 indicating that the bank was refreshed. At block 930, Smart Refresh Component 305 of FIG. 3 can determine if the refresh interval is over. If so, then at block 935 Smart Refresh Component 305 of FIG. 3 can reset the flags in Refresh Status Table 420 of FIG. 4 indicating which banks have been refreshed. Whether or not the refresh interval is over, control returns to block 905 to process the next refresh command.

In FIG. 9 (and in the other flowcharts below), one embodiment of the inventive concept is shown. But a person skilled in the art will recognize that other embodiments of the inventive concept are also possible, by changing the order of the blocks, by omitting blocks, or by including links not shown in the drawings. All such variations of the flowcharts are considered to be embodiments of the inventive concept, whether expressly described or not.

Figure 10A:
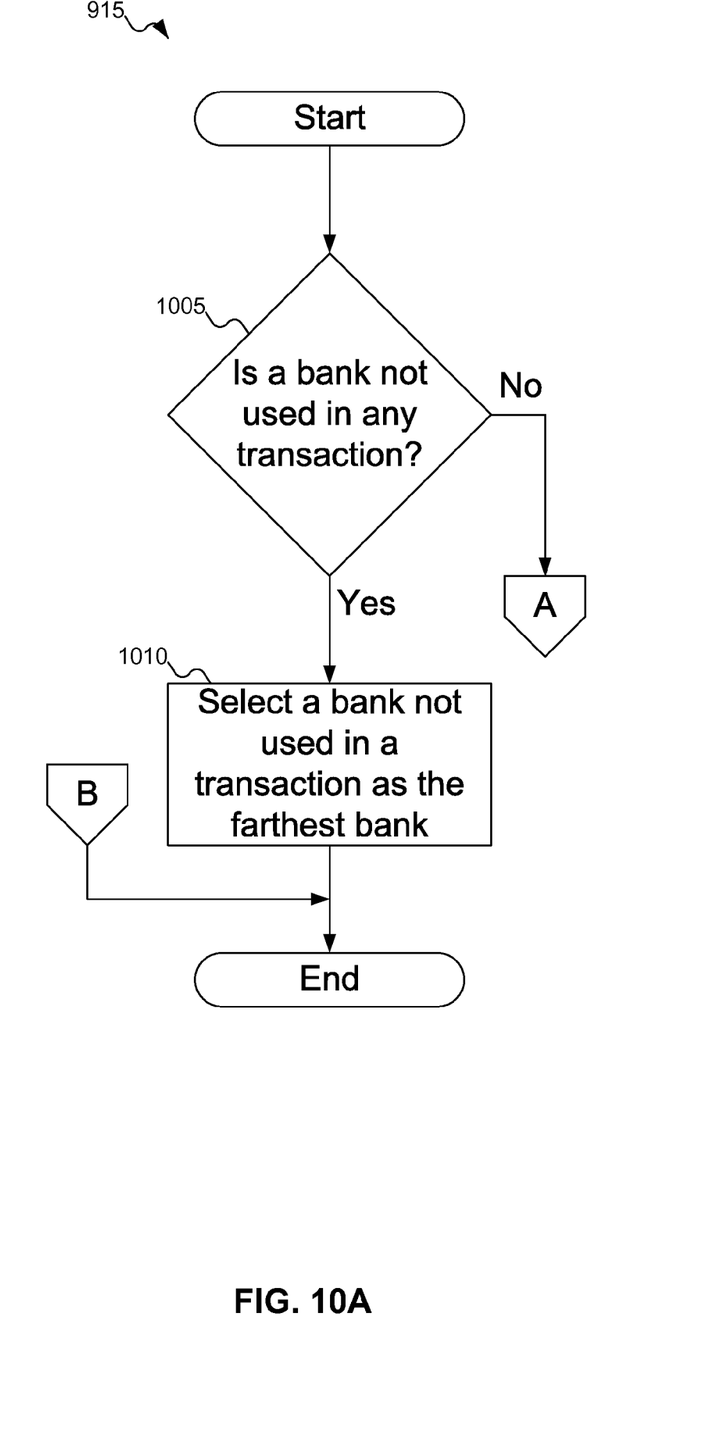
FIGS. 10A-10B show a flowchart of a procedure for selecting a farthest bank to refresh in the DRAM module of FIG. 3.
Figure 10B:
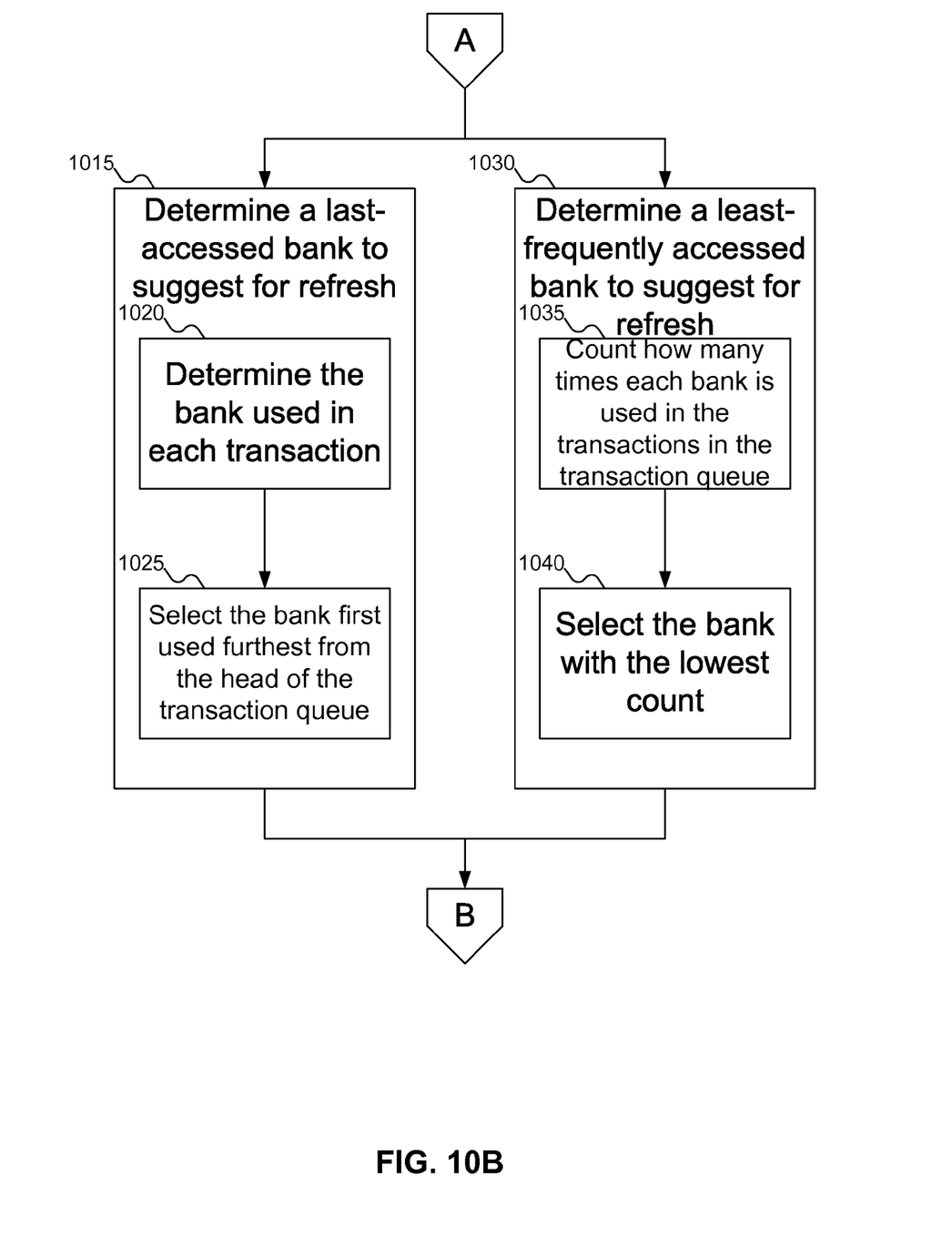

FIGS. 10A-10B show a flowchart of an example procedure for selecting a farthest bank to refresh in DRAM module 105 of FIG. 3, and can be used in step 915 of FIG. 9, according to some embodiments of the inventive concept. In FIG. 10A, at block 1005, Smart Refresh Component 305 of FIG. 3 can determine if any bank is not used in any transaction in transaction queue 430 of FIG. 4. If so, then at block 1010 Smart Refresh Component 305 of FIG. 3 can select a bank not used in any transaction for refresh, after which processing ends.

If every bank is used in at least one transaction in transaction queue 430 of FIG. 4, then at block 1015 (FIG. 10B), Smart Refresh Component 305 of FIG. 3 can determine the last accessed bank in bank ID table 410 of FIG. 4. Smart Refresh Component 305 of FIG. 3 can achieve this result by determining each bank used in a transaction (block 1020) and selecting the bank used furthest from the head of transaction queue 430 of FIG. 4 (block 1025). Alternatively, at block 1030, Smart Refresh Component 305 of FIG. 3 can determine the least frequently accessed bank in bank ID table 410 of FIG. 3. Smart Refresh Component 305 of FIG. 3 can achieve this result by counting how many times each bank is used in the transactions in transaction queue 430 of FIG. 4 (block 1035) and selecting the bank with the lowest count (block 1040).

Regardless of whether Smart Refresh Component 305 of FIG. 3 selects a bank not used in a transaction in transaction queue 430 of FIG. 4 or a farthest bank, Smart Refresh Component 305 of FIG. 3 can suggest the selected bank to refresh engine 115 of FIG. 1.

Figure 11:
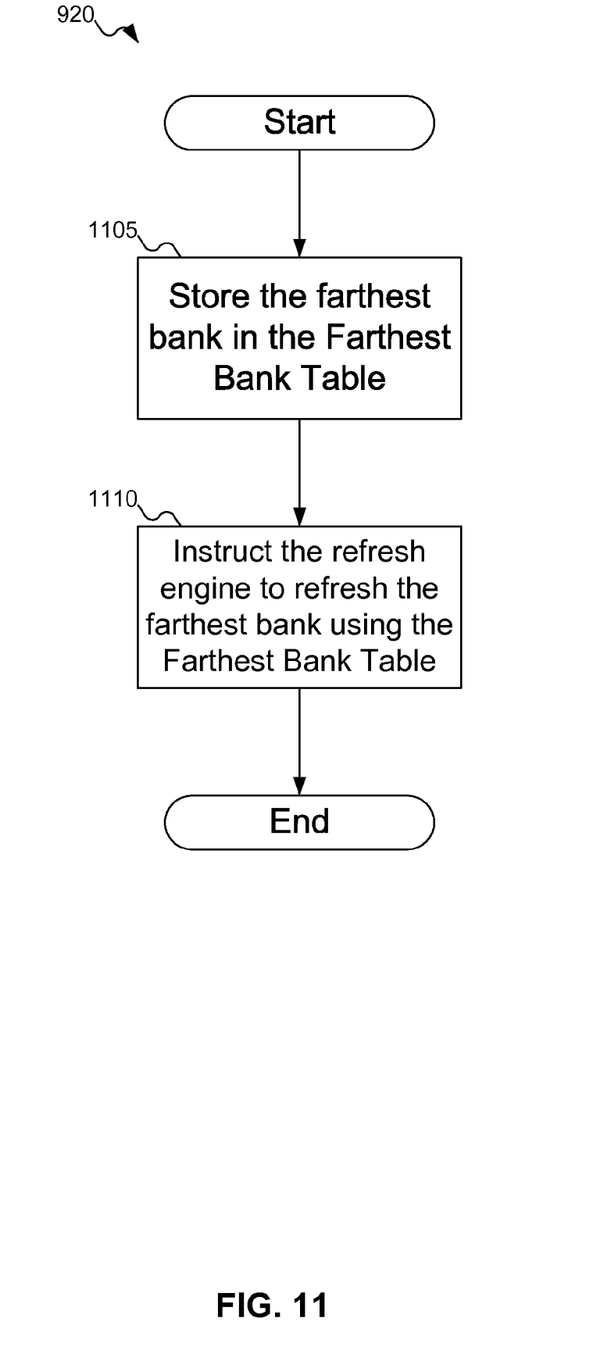
FIG. 11 shows a flowchart of a procedure for updating the Farthest Bank Table of FIG. 4.

FIG. 11 shows a flowchart of an example procedure for updating Farthest Bank Table 425 of FIG. 4, according to an embodiment of the inventive concept. At block 1105, Smart Refresh Component 305 of FIG. 3 can store the farthest bank in Farthest Bank Table 425 of FIG. 4. Then at block 1110, refresh engine 115 of FIG. 1 can refresh the suggested bank.

The following discussion is intended to provide a brief, general description of a suitable machine or machines in which certain aspects of the inventive concept can be implemented. Typically, the machine or machines include a system bus to which is attached processors, memory, e.g., random access memory (RAM), read-only memory (ROM), or other state preserving medium, storage devices, a video interface, and input/output interface ports. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciate that network communication can utilize various wired and/or wireless short range or long range carriers and protocols, including radio frequency (RF), satellite, microwave, Institute of Electrical and Electronics Engineers (IEEE) 802.11, Bluetooth®, optical, infrared, cable, laser, etc.

Embodiments of the present inventive concept can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access.

Embodiments of the inventive concept can include a tangible, non-transitory machine-readable medium comprising instructions executable by one or more processors, the instructions comprising instructions to perform the elements of the inventive concepts as described herein.

Having described and illustrated the principles of the inventive concept with reference to illustrated embodiments, it will be recognized that the illustrated embodiments can be modified in arrangement and detail without departing from such principles, and can be combined in any desired manner. And, although the foregoing discussion has focused on particular embodiments, other configurations are contemplated. In particular, even though expressions such as "according to an embodiment of the inventive concept" or the like are used herein, these phrases are meant to generally reference embodiment possibilities, and are not intended to limit the inventive concept to particular embodiment configurations. As used herein, these terms can reference the same or different embodiments that are combinable into other embodiments.

The foregoing illustrative embodiments are not to be construed as limiting the inventive concept thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this inventive concept as defined in the claims.

Embodiments of the inventive concept can extend to the following statements, without limitation:

Statement 1.

An embodiment of the inventive concept includes a dynamic Random Access Memory (DRAM) module, comprising:

a plurality of banks, each of the plurality of banks to store data;

a refresh engine to refresh one of the plurality of banks in the DRAM module; and a Smart Refresh Component to advise the refresh engine regarding which of the plurality of banks in the DRAM module to refresh, the Smart Refresh Component including:

a Farthest Bank Table to identify a farthest bank of the plurality of banks in the DRAM module;

a Refresh Status Table to identify which banks in the plurality of banks in the DRAM module have been refreshed; and     logic to identify the farthest bank in the Farthest Bank Table using a transaction queue for the DRAM module and the Refresh Status Table.

Statement 2.

An embodiment of the inventive concept includes a DRAM module according to statement 1, wherein the logic to identify the farthest bank includes a time-based refresh circuit to suggest refreshing a last-accessed bank.

Statement 3.

An embodiment of the inventive concept includes a DRAM module according to statement 2, wherein the time-based refresh circuit includes a logic to identify the last-accessed bank in the Farthest Bank Table using the transaction queue for the DRAM module and the Refresh Status Table.

Statement 4.

An embodiment of the inventive concept includes a DRAM module according to statement 1, wherein the logic to identify the farthest bank includes a frequency-based refresh circuit to suggest refreshing a least-frequently-accessed bank.

Statement 5.

An embodiment of the inventive concept includes a DRAM module according to statement 4, wherein the time-based refresh circuit includes a logic to identify the least-frequently-accessed bank in the Farthest Bank Table using the transaction queue for the DRAM module and the Refresh Status Table.

Statement 6.

An embodiment of the inventive concept includes a DRAM module according to statement 1, the Smart Refresh Component further including a reset logic to reset the Refresh Status Table at an end of a refresh interval.

Statement 7.

An embodiment of the inventive concept includes a DRAM module according to statement 1, wherein the DRAM module is a synchronous DRAM module.

Statement 8.

An embodiment of the inventive concept includes a DRAM module according to statement 1, wherein the DRAM module is a transaction-based DRAM module.

Statement 9.

An embodiment of the inventive concept includes a DRAM module according to statement 1, wherein the logic is responsive to a refresh trigger from a refresh counter.

Statement 10.

An embodiment of the inventive concept includes a computer system, comprising:

a processor;

a memory controller to interface between the processor and a dynamic Random Access Memory (DRAM) module; and the DRAM module, including:

a plurality of banks, each of the plurality of banks to store data;

a refresh engine to refresh one of the plurality of banks in the DRAM module; and a Smart Refresh Component to advise the refresh engine regarding which of the plurality of banks in the DRAM module to refresh, the Smart Refresh Component including:

a Farthest Bank Table to identify a farthest bank of the plurality of banks in the DRAM module;

a Refresh Status Table to identify which banks in the plurality of banks in the DRAM module have been refreshed; and logic to identify the farthest bank in the Farthest Bank Table using a transaction queue for the DRAM module and the Refresh Status Table.

Statement 11.

An embodiment of the inventive concept includes a computer system according to statement 10, wherein the logic to identify the farthest bank includes a time-based refresh circuit to suggest refreshing a last-accessed bank.

Statement 12.

An embodiment of the inventive concept includes a computer system according to statement 11, wherein the time-based refresh circuit includes a logic to identify the last-accessed bank in the Farthest Bank Table using the transaction queue for the DRAM module and the Refresh Status Table.

Statement 13.

An embodiment of the inventive concept includes a computer system according to statement 10, wherein the logic to identify the farthest bank includes a frequency-based refresh circuit to suggest refreshing a least-frequently-accessed bank.

Statement 14.

An embodiment of the inventive concept includes a computer system according to statement 13, wherein the time-based refresh circuit includes a logic to identify the last-accessed bank in the Farthest Bank Table using the transaction queue for the DRAM module and the Refresh Status Table.

Statement 15.

An embodiment of the inventive concept includes a method, comprising:

accessing a list of banks from a set of transactions in a transaction queue, the list of banks identifying banks from a plurality of banks in a dynamic Random Access Memory (DRAM) module, each of the plurality of banks to store data;

determining a farthest bank of the plurality of banks in the DRAM module using the list of banks; and refreshing the farthest bank.

Statement 16.

An embodiment of the inventive concept includes a method according to statement 15, further comprising setting a refreshed flag associated with the farthest bank indicating that the farthest bank was refreshed.

Statement 17.

An embodiment of the inventive concept includes a method according to statement 16, wherein determining a farthest bank includes determining the farthest bank of the plurality of banks in the DRAM module using the list of banks, wherein the farthest bank is not flagged as refreshed.

Statement 18.

An embodiment of the inventive concept includes a method according to statement 16, further comprising resetting the refreshed flags for each of the plurality of banks in the DRAM module when a refresh interval ends.

Statement 19.

An embodiment of the inventive concept includes a method according to statement 15, wherein determining a farthest bank of the plurality of banks in the DRAM module using the list of banks includes determining the farthest bank as a last-accessed bank of the plurality of banks in the DRAM module using the list of banks.

Statement 20.

An embodiment of the inventive concept includes a method according to statement 19, wherein determining the farthest bank as a last-accessed bank of the plurality of banks in the DRAM module using the list of banks includes:

determining what bank each transaction in the transaction queue uses; and selecting a bank first used in a transaction that is farthest from a head of the transaction queue as the least-frequently-accessed bank.

Statement 21.

An embodiment of the inventive concept includes a method according to statement 15, wherein determining a farthest bank of the plurality of banks in the DRAM module using the list of banks includes determining the farthest bank as a least-frequently-accessed bank of the plurality of banks in the DRAM module using the list of banks.

Statement 22. An embodiment of the inventive concept includes a method according to statement 21, wherein determining the farthest bank as a least-frequently-accessed bank of the plurality of banks in the DRAM module using the list of banks includes:

counting how many times each bank of the plurality of banks in the DRAM module is used in a transaction in the transaction queue; and selecting a bank with a lowest count as the least-frequently-accessed bank.

Statement 23.

An embodiment of the inventive concept includes a method according to statement 15, wherein determining a farthest bank of the plurality of banks in the DRAM module using the list of banks further includes:

determining a first bank of the plurality of banks in the DRAM module that is not in the list of banks; and selecting the first bank as the farthest bank.

Statement 24.

An embodiment of the inventive concept includes a method according to statement 15, wherein refreshing the farthest bank includes:

storing the farthest bank of the plurality of banks in the DRAM module in a Farthest Bank Table; and instructing a refresh engine to refresh the farthest bank using the Farthest Bank Table.

Statement 25.

An embodiment of the inventive concept includes a method according to statement 15, wherein refreshing the farthest bank includes refreshing the farthest bank responsive to a refresh trigger from a refresh counter.

Consequently, in view of the wide variety of permutations to the embodiments described herein, this detailed description and accompanying material is intended to be illustrative only, and should not be taken as limiting the scope of the inventive concept. What is claimed as the inventive concept, therefore, is all such modifications as may come within the scope and spirit of the following claims and equivalents thereto.

What is claimed is:

1. A dynamic Random Access Memory (DRAM) module, comprising:
    a plurality of banks, each of the plurality of banks to store data;
    a refresh engine to refresh one of the plurality of banks in the DRAM module; and
    a Smart Refresh Component to advise the refresh engine regarding which of the plurality of banks in the DRAM module to refresh, the Smart Refresh Component including:
        a Farthest Bank Table to identify a farthest bank of the plurality of banks in the DRAM module;
        a Refresh Status Table to identify which banks in the plurality of banks in the DRAM module have been refreshed; and
        logic to identify the farthest bank in the Farthest Bank Table using a transaction queue for the DRAM module and the Refresh Status Table.

2. A DRAM module according to claim 1, wherein the logic to identify the farthest bank includes a time-based refresh circuit to suggest refreshing a last-accessed bank.

3. A DRAM module according to claim 2, wherein the time-based refresh circuit includes a logic to identify the last-accessed bank in the Farthest Bank Table using the transaction queue for the DRAM module and the Refresh Status Table.

4. A DRAM module according to claim 1, wherein the logic to identify the farthest bank includes a frequency-based refresh circuit to suggest refreshing a least-frequently-accessed bank.

5. A DRAM module according to claim 4, wherein the time-based refresh circuit includes a logic to identify the least-frequently-accessed bank in the Farthest Bank Table using the transaction queue for the DRAM module and the Refresh Status Table.

6. A DRAM module according to claim 1, the Smart Refresh Component further including a reset logic to reset the Refresh Status Table at an end of a refresh interval.

7. A DRAM module according to claim 1, wherein the DRAM module is a synchronous DRAM module.

8. A DRAM module according to claim 1, wherein the DRAM module is a transaction-based DRAM module.

9. A DRAM module according to claim 1, wherein the logic is responsive to a refresh trigger from a refresh counter.

10. A method, comprising:
    accessing a list of banks from a set of transactions in a transaction queue, the list of banks identifying banks from a plurality of banks in a dynamic Random Access Memory (DRAM) module, each of the plurality of banks to store data;
    determining a farthest bank of the plurality of banks in the DRAM module using the list of banks; and
    refreshing the farthest bank.

11. A method according to claim 10, further comprising setting a refreshed flag associated with the farthest bank indicating that the farthest bank was refreshed.

12. A method according to claim 11, wherein determining a farthest bank includes determining the farthest bank of the plurality of banks in the DRAM module using the list of banks, wherein the farthest bank is not flagged as refreshed.

13. A method according to claim 11, further comprising resetting the refreshed flags for each of the plurality of banks in the DRAM module when a refresh interval ends.

14. A method according to claim 10, wherein determining a farthest bank of the plurality of banks in the DRAM module using the list of banks includes determining the farthest bank as a last-accessed bank of the plurality of banks in the DRAM module using the list of banks.

15. A method according to claim 14, wherein determining the farthest bank as a last-accessed bank of the plurality of banks in the DRAM module using the list of banks includes:
    determining what bank each transaction in the transaction queue uses; and
    selecting a bank first used in a transaction that is farthest from a head of the transaction queue as the least-frequently-accessed bank.

16. A method according to claim 10, wherein determining a farthest bank of the plurality of banks in the DRAM module using the list of banks includes determining the farthest bank as a least-frequently-accessed bank of the plurality of banks in the DRAM module using the list of banks.

17. A method according to claim 16, wherein determining the farthest bank as a least-frequently-accessed bank of the plurality of banks in the DRAM module using the list of banks includes:
    counting how many times each bank of the plurality of banks in the DRAM module is used in a transaction in the transaction queue; and
    selecting a bank with a lowest count as the least-frequently-accessed bank.

18. A method according to claim 10, wherein determining a farthest bank of the plurality of banks in the DRAM module using the list of banks further includes:
    determining a first bank of the plurality of banks in the DRAM module that is not in the list of banks; and
    selecting the first bank as the farthest bank.

19. A method according to claim 10, wherein refreshing the farthest bank includes:
    storing the farthest bank of the plurality of banks in the DRAM module in a Farthest Bank Table; and
    instructing a refresh engine to refresh the farthest bank using the Farthest Bank Table.

20. A method according to claim 10, wherein refreshing the farthest bank includes refreshing the farthest bank responsive to a refresh trigger from a refresh counter.

* * * * *